US 11,721,384 B2

(12) United States Patent
Kotra

(10) Patent No.: US 11,721,384 B2
(45) Date of Patent: Aug. 8, 2023

(54) HARDWARE-ASSISTED DYNAMIC RANDOM ACCESS MEMORY (DRAM) ROW MERGING

(71) Applicant: ADVANCED MICRO DEVICES, INC., Santa Clara, CA (US)

(72) Inventor: Jagadish B. Kotra, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 17/025,157

(22) Filed: Sep. 18, 2020

(65) Prior Publication Data

US 2021/0327494 A1    Oct. 21, 2021

Related U.S. Application Data

(60) Provisional application No. 63/011,397, filed on Apr. 17, 2020.

(51) Int. Cl.
*G11C 11/406* (2006.01)
*G11C 11/408* (2006.01)
*G11C 11/409* (2006.01)

(52) U.S. Cl.
CPC ...... *G11C 11/40622* (2013.01); *G11C 11/409* (2013.01); *G11C 11/4085* (2013.01); *G11C 11/40607* (2013.01)

(58) Field of Classification Search
CPC .............................. G11C 11/406222
USPC .............................................. 711/3
See application file for complete search history.

(56) References Cited

U.S. PATENT DOCUMENTS

| | | | | |
|---|---|---|---|---|
| 2006/0236036 A1* | 10/2006 | Gschwind | ........... | G06F 12/0862 711/137 |
| 2011/0060887 A1* | 3/2011 | Thatcher | ............... | G06F 3/0626 711/171 |
| 2014/0289574 A1* | 9/2014 | Tsern | ............... | G11C 29/50016 714/718 |
| 2017/0047110 A1* | 2/2017 | Kang | .................. | G11C 11/4087 |
| 2018/0276150 A1* | 9/2018 | Eckert | ................. | G06F 13/4068 |
| 2019/0324689 A1 | 10/2019 | Choi et al. | | |
| 2020/0098420 A1 | 3/2020 | Li et al. | | |

FOREIGN PATENT DOCUMENTS

| | | |
|---|---|---|
| EP | 0407119 A2 | 1/1991 |
| EP | 3279899 A1 | 2/2018 |

OTHER PUBLICATIONS

International Search Report and Written Opinion, PCT/US2021/027505, dated Jul. 14, 2021, 12 pages.
Seikwon Kim et al., Zebra Refresh: Value Transformation for Zero-Aware DRAM Refresh Reduction, IEEE Computer Architecture Letters, vol. 17, No. 2, DOI: 10.1109/LCA.2018.2822808, Date of Publication: Apr. 4, 2018, 4 pages.
Wikipedia, Memory refresh, URL: https://en.wikipedia.org/wiki/Memory_refresh, last edited: Feb. 19, 2021, printed Jul. 12, 2021, 7 pages.

* cited by examiner

*Primary Examiner* — Min Huang

(57) ABSTRACT

Hardware-assisted Dynamic Random Access Memory (DRAM) row merging, including: identifying, by a memory controller, in a DRAM module, a plurality of rows storing identical data; storing, in a mapping table, data mapping one or more rows of the plurality of rows to another row; and excluding the one or more rows from a refresh the DRAM module.

18 Claims, 8 Drawing Sheets

HARDWARE-ASSISTED DYNAMIC RANDOM ACCESS MEMORY (DRAM) ROW MERGING

CROSS-REFERENCE TO RELATED APPLICATION

This application claims priority to U.S. Provisional Patent Application No. 63/011,397, filed Apr. 17, 2020, which is hereby incorporated by reference in its entirety.

BACKGROUND

Dynamic Random Access Memory (DRAM) rows must be refreshed to ensure data integrity. Refreshes of Dynamic Random Access Memory make up a significant portion of the power used by a memory module. In some environments, multiple rows of Dynamic Random Access Memory store identical values.

DETAILED DESCRIPTION

Figure 1:
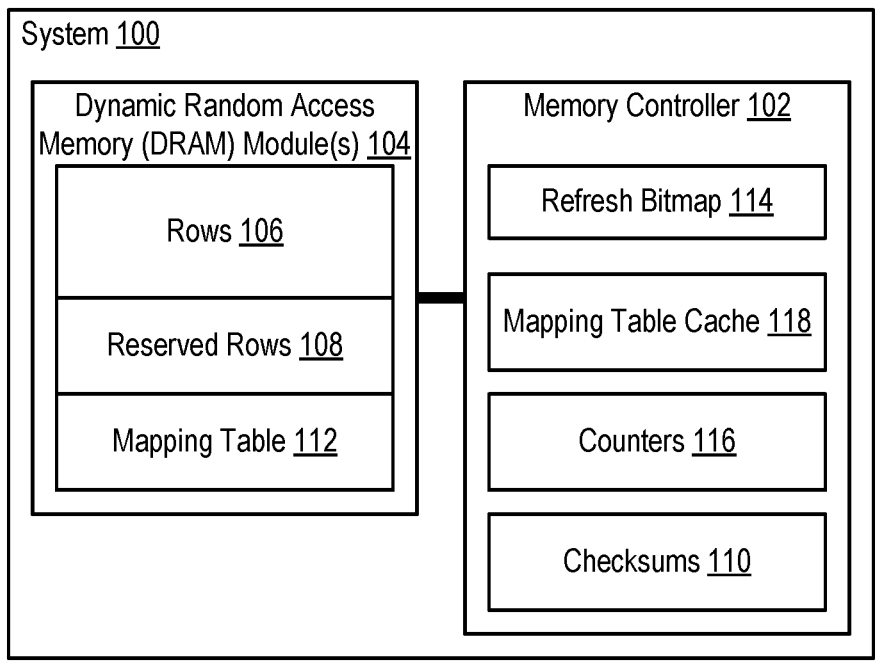
FIG. 1 is a block diagram of an example system for hardware-assisted DRAM row merging according to some embodiments.

In some embodiments, hardware-assisted Dynamic Random Access Memory (DRAM) row merging includes, among other elements, identifying, by a memory controller, in a DRAM module, a plurality of rows storing identical data. The hardware-assisted DRAM row merging further includes storing, in a mapping table, data mapping one or more rows of the plurality of rows to another row, and excluding the one or more rows from a refresh the DRAM module.

In some embodiments, the hardware-assisted DRAM row merging further includes updating a bitmap to indicate that the one or more rows are excluded from the refresh. In such an embodiment, excluding the one or more rows from the refresh includes providing, by the memory controller, the bitmap to the DRAM module. In some embodiments, the other row includes a row in the plurality of rows. In other embodiments, the other row includes a reserved row included in one or more reserved rows of the DRAM module. In some embodiments, the hardware-assisted DRAM row merging further includes determining that a single row is mapped to the reserved row. In response to such a determination, the memory controller stores, in the single row, data stored in the reserved row and updates the mapping table to remove a mapping of the single row to the reserved row. In some embodiments, the hardware-assisted DRAM row merging further includes maintaining a counter indicating a number of rows mapped to the reserved row. In such an embodiment, determining that the single row is mapped to the reserved row is based on the counter. In some embodiments, the hardware-assisted DRAM row merging further includes maintaining a mapping table cache storing a portion of the mapping table. In some embodiments, the hardware-assisted DRAM row merging further includes receiving a read request for a row in the one or more rows. In response to receiving the read request, the memory controller determines, based on the mapping table, that the row is mapped to the other row and provides data stored in the other row. In some embodiments, the hardware-assisted DRAM row merging further includes receiving a write request for a particular row of the one or more rows. In response to the write request, the memory controller stores, in the particular row of the one or more rows, data stored in the reserved row. The memory controller then performs the write request and updates the mapping table to remove a mapping of the particular row to the reserved row.

In some embodiments, a memory controller for hardware-assisted DRAM row merging performs steps including, among other elements, identifying, by a memory controller, in a DRAM module, a plurality of rows storing identical data. The steps further include storing, in a mapping table, data mapping one or more rows of the plurality of rows to another row, and excluding the one or more rows from a refresh the DRAM module.

In some embodiments, the steps further include updating a bitmap to indicate that the one or more rows are excluded from the refresh. In such an embodiment, excluding the one or more rows from the refresh includes providing, by the memory controller, the bitmap to the DRAM module. In some embodiments, the other row includes a row in the plurality of rows. In other embodiments, the other row includes a reserved row included in one or more reserved rows of the DRAM module. In some embodiments, the steps further include determining that a single row is mapped to the reserved row. In response to such a determination, the memory controller stores, in the single row, data stored in the reserved row and updates the mapping table to remove a mapping of the single row to the reserved row. In some embodiments, the steps further include maintaining a counter indicating a number of rows mapped to the reserved row. In such an embodiment, determining that the single row is mapped to the reserved row is based on the counter. In some embodiments, the steps further include maintaining a mapping table cache storing a portion of the mapping table. In some embodiments, the steps further include receiving a read request for a row in the one or more rows. In response to receiving the read request, the memory controller determines, based on the mapping table, that the row is mapped to the other row and provides data stored in the other row. In some embodiments, the steps further include receiving a write request for a particular row of the one or more rows. In response to the write request, the memory controller stores, in the particular row of the one or more rows, data stored in the reserved row. The memory controller then performs the write request and updates the mapping table to remove a mapping of the particular row to the reserved row.

In some embodiments, an apparatus for hardware-assisted DRAM row merging includes a memory controller that performs steps including, among other elements, identifying, by a memory controller, in a DRAM module, a plurality of rows storing identical data. The steps further include storing, in a mapping table, data mapping one or more rows of the plurality of rows to another row, and excluding the one or more rows from a refresh the DRAM module.

In some embodiments, the steps further include updating a bitmap to indicate that the one or more rows are excluded from the refresh. In such an embodiment, excluding the one or more rows from the refresh includes providing, by the memory controller, the bitmap to the DRAM module.

FIG. 1 is a block diagram of a non-limiting example system 100. The example system 100 can be implemented in a variety of devices, including central processing units (CPUs), graphics processing units (GPUs), and the like. The system 100 includes a memory controller 102 and one or more Dynamic Random Access Memory (DRAM) modules 106. The DRAM modules 104 each include a plurality of rows 106 for storing data. The memory controller 102 processes read and write requests issued to the DRAM modules 104. For example, the memory controller 102 maintains queues of read requests and write requests, and issues queued requests to the particular DRAM module 104 to which the request is directed.

The rows 106 are volatile memory for storing data. As the rows 106 are volatile, the rows 106 must be periodically refreshed to maintain integrity of the stored data. These refreshes make up a significant portion of the power utilized by a DRAM module 104. In many environments, multiple rows 106 within the same DRAM module 104 store identical data. That is, each value in one row 106 is identical to each value in one or more other rows 106. For example, in an environment where multiple virtual machines are executed on the same hardware and the virtual machines are executing identical software or operating systems, data stored in the allocated portions of DRAM for each virtual machine would be at least partially identical.

Existing solutions for addressing identical data across rows of DRAM include software modules managed by hypervisors or other agents that deduplicate data from the identical rows. However, to reduce bottlenecks involved in deduplicating DRAM content, these modules are typically only executed with the total available memory in a system falls below a threshold. Moreover, as these solutions are software-based, computational overhead and resources are required in order to deduplicate the data stored in DRAM.

Instead of using a software-based solution that requires considerable computational overhead and is limited to execution when total system memory falls below a threshold, the system 100 uses a hardware-based approach for merging rows 106 storing identical data within the DRAM modules 104. The memory controller 102 identifies, in a DRAM module 104, a plurality of rows storing identical data. For example, the plurality of rows can each include rows 106 of the DRAM module 104. As another example, the plurality of rows can include one or more rows 106 sharing identical data with a reserved row 108. A reserved row 108 is a row of memory in a DRAM module 104 reserved for storing data from rows 106 identified as storing identical data. In other words, while rows 106 are used for servicing read and write operations from other processes or agents, reserved rows 108 are exclusively used for storing data from rows 106 identified as storing identical data.

In some embodiments, identifying a plurality of rows storing identical data is performed at a predefined interval or in response to another event. For example, the memory controller 102 identifies, within rows 106, two or more of the rows 106 storing identical data in response to occurrence of the event. As another example, the memory controller 102 identifies, within the rows 106, one or more rows 106 storing data identical to a reserved row 108 in response to occurrence of the event. In some embodiments, identifying the plurality of rows is performed in response to a read or write request issued to a row 106. For example, the memory controller 102 compares the data read from or to be written to a row 106 to data in another row 106 or to a reserved row 108. In some embodiments, this includes performing a checksum 110 or hash of the data read from or to be written to a row 106 and compares it to one or more stored checksums 110, as will be described in more detail below.

The memory controller 102 then stores, in a mapping table 112, data mapping one or more rows of the plurality of rows to another row. Each entry of the mapping table 112 maps a row 106 in the DRAM module 104 to another row, where the other row stores data identical to data last stored in the row 106 to which it is mapped. Although the mapping table 112 is showed as being stored in the DRAM module 104, it is understood that, in some embodiments, the mapping table 112 is instead stored in the memory controller 102.

In some embodiments, storing data mapping one or more rows to another row includes storing data mapping one or more rows 106 of a plurality of identified rows 106 to another row 106 in the plurality of identified rows 106. For example, assume that the memory controller 102 identified rows 106 A, B, C, and D as each storing identical data. In such an example, the memory controller 102 stores, in the mapping table 112, entries mapping rows 106 A, B, and C to row 106 D. In this example, row 106 D is considered a "representative row" as the remaining rows are mapped to it. Furthermore, in this example, row 106 D is arbitrarily selected as the representative row, and it is understood that other rows 106 are possible representative rows.

As another example, assume that the memory controller 102 identified rows 106 A, B, C, and D as each storing identical data. The memory controller 102 then stores, in a reserved row 108, data equal to that stored in rows 106 A, B, C, and D and stores, in the mapping table 112, entries mapping rows 106 A, B, C, and D to the reserved row 108. In a further example, assume the memory controller 102 identifies rows 106 A, B, and C as storing data equal to data already stored in a reserved row 108. The memory controller 102 then stores, in the mapping table 112, entries mapping rows 106 A, B, and C to the reserved row 108.

The memory controller 102 then excludes the one or more rows 106 (e.g., those rows 106 mapped to another row in the mapping table 112) from a refresh of the DRAM module 104. For example, the memory controller 102 provides, to the DRAM module 104, an indication of those rows 106 that should or should not be refreshed during a next refresh operation. In some embodiments, the memory controller 102 maintains a refresh bitmap 114. Each row 106 corresponds to a bit in the refresh bitmap 114. Where a row 106 is mapped to another row (e.g., to a representative row or to a reserved row 108), the bit corresponding to the mapped row 106 is set (e.g., to "1") to indicate that the mapped row 106 should be skipped during a next refresh. For example, when a mapping table 112 entry is created to map a particular row 106, a bit in the refresh bitmap 114 corresponding to the particular row 106 is set to indicate that the particular row 106 is excluded from a next refresh. Accordingly, in some embodiments, excluding the one or more rows 106 from the refresh includes providing, to the DRAM module 104, the refresh bitmap 114. The DRAM module 104 then performs the refresh operation based on the refresh bitmap 114.

According to the approach set forth above, one or more rows 106 storing data identical to another row (e.g., a representative row or a reserved row 108) are excluded from a refresh operation, saving energy when compared to refreshing those rows 106. Such rows 106 are hereinafter referred to as "merged rows 106." Read operations directed to these merged rows 106 are serviced by accessing the mapping table 112 to determine where the merged rows 106 are mapped (e.g., a target of the mapping), and then loading the corresponding data from the target of the mapping.

As is set forth above, merged rows 106 are alternatively mapped to a representative row (included in the rows 106), or to a reserved row 108. As a representative row is still able to be the target of write requests, mapping to a representative row presents a risk of significant overhead when written to. For example, when writing to a representative row, the data stored in the representative row should be copied to another row, and any mapping table 112 entry mapping to the representative row should be updated to this other row. Accordingly, as reserved rows 108 are only written to in order to store data of merged rows 106, in a preferred embodiment, rows 106 to be merged are mapped to a reserved row 108.

In some embodiments, the memory controller 112 maintains, for each reserved row 108, a corresponding counter 116 indicating a number of merged rows 106 mapped to the reserved row 108. For example, as a mapping table 112 entry is created mapping a merged row 106 to a reserved row 108, the memory controller 102 increments the counter 116 corresponding to the reserved row 108. When a merged row 106 ceases to be mapped to the reserved row 108 (e.g., in response to a write directed to the merged row 106), the counter 116 corresponding to the reserved row 108 is decremented. In some embodiments, the counters 116 are maintained in a same data structure as checksums 110 for each reserved row 108. For example, each entry in the data structure corresponds to a reserved row 108. Each entry in the data structure indicates, for the corresponding reserved row 108, a checksum 110 for data stored in the reserved row 108 (if any) and a counter 116 indicating a number of merged rows 106 mapped to the reserved row 108.

Accordingly, in some embodiments, the memory controller 102 determines when a single row 106 is mapped to a reserved row 108. For example, the memory controller 102 determines when a counter 116 corresponding to the reserved row 108 is set to "1." As another example, the memory controller 108 accesses mapping table 112 entries that map to the reserved row 108 and determines that a single mapping table 112 maps to the reserved row 108.

In response to determining that the single row 106 is mapped to the reserved row 108, the memory controller 102 stores, in the single row 106, the data stored in the reserved row 108. For example, the memory controller 102 issues a command to the DRAM module 104 that causes the data stored in the reserved row 108 to be copied or cloned to the single row 106 mapped to the reserved row 106. This ensures that the single row 106 stores the correct data in the event that data previously stored in the single row 106 has degraded due to lack of refresh. The memory controller 102 then updates the mapping table 112 to remove a mapping of the single row 106 to the reserved row 108. In some embodiments, the memory controller 102 then decrements the counter corresponding to the reserved row 108 to zero. In some embodiments, this indicates that the reserved row 108 is unallocated and available for storage of other data for mapping other rows 106 for merging. In some embodiments, the memory controller 102 updates the refresh bitmap 114 to indicate that the single row 106, now no longer mapped to any reserved row 108, should be included in a next refresh.

As is set forth above, in some embodiments, the memory controller 102 maintains checksums 110 for data stored in each reserved row 108. The checksums 108 facilitate determining whether data read from or written to a row 106 matches a reserved row 108. For example, in response to a write request to a row 106, the memory controller 102 determines that the data to be written matches a reserved row 108. Instead of performing the write request, the memory controller 102 creates a mapping table 112 entry mapping the row 106 targeted by the write request to the reserved row 108. In some embodiments, the memory controller 102 then updates the refresh bitmap 114 to indicate that the row 106 targeted by the write request, now a merged row 106, is excluded from a refresh of the DRAM module 104. As another example, in response to a read request for a row 106, the memory controller 102 determines, based on the checksum 110, that the read data matches the data stored in a reserved row 108. The memory controller 102 then creates a mapping table 112 entry mapping the read row 106 to the reserved row 108, and updates the refresh bitmap 114 to exclude the read row 106 from a refresh of the DRAM module 104.

In some embodiments, the memory controller 102 maintains a mapping table cache 118 storing most recently or most frequently used mappings in the mapping table 112. For example, the memory controller 102 accesses the mapping table 112 to determine if a row 106 targeted by a read or write request is mapped to another row (e.g., a representative row or a reserved row 108). Where the memory controller 102 finds a match in the mapping table 112, the memory controller 102 updates the mapping table cache 118 to include the matching mapping table 112 entry. Thus, read or write requests are first compared to entries in the mapping table cache 118 before accessing the mapping table 112, reducing the number of accesses to the DRAM module 104 required to determine if a particular row 106 has been merged and mapped to another row.

In response to a read request directed to a row 106 in the DRAM module 104, the memory controller 102 determines if the row 106 has been merged and is mapped to another row (e.g., a representative row or a reserved row 108). For example, the memory controller 102 access the mapping table cache 118 to determine if an entry exists mapping the row 106. If no entry is found, or the mapping table cache 118 is not implemented, the memory controller 102 accesses the mapping table 112 to determine if an entry exists mapping the row 106. If an entry exists in the mapping table cache 118 or the mapping table 112, the row targeted by the mapping indicated in the entry accessed and the stored data is retrieved. This data is then returned in response to the read request. In some embodiments, the identified entry of the mapping table 112 is added to the mapping table cache 118.

In response to a write request directed to a row 106 in the DRAM module 104, the memory controller 102 determines if the row 106 has been merged and is mapped to a reserved row 108. For example, the memory controller 102 access the mapping table cache 118 to determine if an entry exists mapping the row 106 to a reserved row 108. If no entry is found, or the mapping table cache 118 is not implemented, the memory controller 102 accesses the mapping table 112 to determine if an entry exists mapping the row 106 to the reserved row 108.

If an entry exists in the mapping table cache 118 or the mapping table 112, the reserved row 108 is accessed and the contents of the reserved row 108 are copied to the row 106 targeted by the write request. The write request is then applied to the row 106. The mapping table 112 entry (and, if existing, a mapping table cache 118 entry) mapping the row 106 to the reserved row 108 is removed. In some embodiments, a counter 116 corresponding to the reserved row 108 is decremented.

Figure 2:
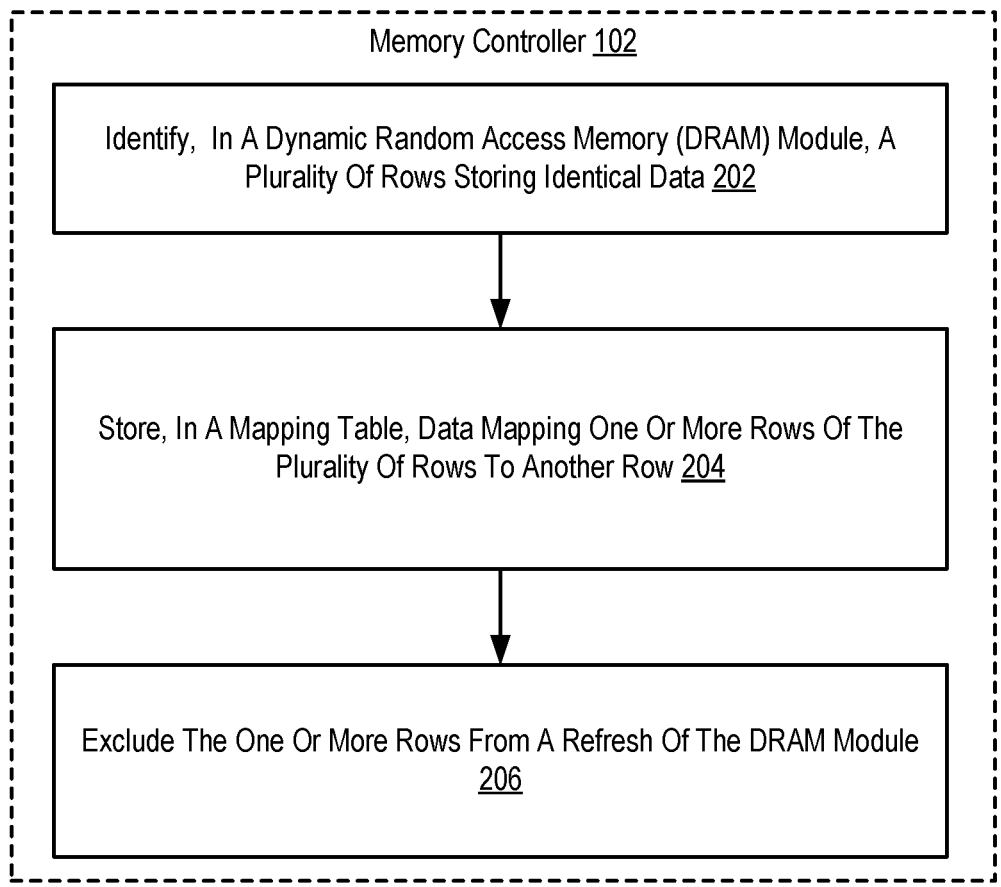
FIG. 2 is a flowchart of an example method for hardware-assisted DRAM row merging according to some embodiments.

For further explanation, FIG. 2 sets forth a flow chart illustrating an exemplary method for hardware-assisted DRAM row merging that includes identifying 202 (e.g., by a memory controller 102), in a DRAM module 104, a plurality of rows storing identical data. For example, the plurality of rows each include rows 106 of the DRAM module 104. As another example, the plurality of rows include one or more rows 106 and a reserved row 108, where the one or more rows 106 share identical data with the reserved row 108. For example, in some embodiments, a reserved row 108 stores data by virtue of previously merging and mapping other rows 106 to the reserved row.

In some embodiments, identifying 202 the plurality of rows storing identical data is performed at a predefined interval or in response to another event. For example, the memory controller 102 identifies, within rows 106, two or more of the rows 106 storing identical data in response to occurrence of the event. As another example, the memory controller 102 identifies, within the rows 106, one or more rows 106 storing data identical to a reserved row 108. In some embodiments, identifying the plurality of rows is performed in response to a read or write request issued to a row 106. For example, the memory controller 102 compares the data read from or to be written to a row 106 to data in another row 106 or to a reserved row 108.

The method of FIG. 2 also includes storing 204, in a mapping table 112, data mapping one or more rows 106 of the plurality of rows to another row. Each entry of the mapping table 112 maps a row 106 in the DRAM module 104 to another row, where the other row stores data identical to data last stored in the row 106 to which it is mapped. In some embodiments, the other row includes a row 106 of the DRAM module 104 (e.g., a row 106 able to be targeted by read and write requests). In other embodiments, the other row to which the rows 106 are mapped includes a reserved row 108 that is reserved for storing data and being mapped to by rows 106. Although the mapping table 112 is showed as being stored in the DRAM module 104, it is understood that, in some embodiments, the mapping table 112 is instead stored in the memory controller 102.

In some embodiments, storing 204 data mapping one or more rows 106 to another row includes storing data mapping one or more rows 106 of a plurality of identified rows 106 to another row 106 in the plurality of identified rows 106. For example, assume that the memory controller 102 identified rows 106 A, B, C, and D as each storing identical data. In such an example, the memory controller 102 stores, in the mapping table 112, entries mapping rows 106 A, B, and C to row 106 D. In this example, row 106 D is considered a "representative row" as the remaining rows 106 are mapped to it. Furthermore, in this example, row 106 D is arbitrarily selected as the representative row, and it is understood that other rows 106 are possible representative rows and that representative rows are selectable according to various criteria.

As another example, assume that the memory controller 102 identified rows 106 A, B, C, and D as each storing identical data. The memory controller 102 then stores, in a reserved row 108, data equal to that stored in rows 106 A, B, C, and D and stores, in the mapping table 112, entries mapping rows 106 A, B, C, and D to the reserved row 108. In a further example, assume the memory controller 102 identifies rows 106 A, B, and C as storing data equal to data already stored in a reserved row 108. The memory controller 102 then stores, in the mapping table 112, entries mapping rows 106 A, B, and C to the reserved row 108.

The method of FIG. 2 further includes excluding 206 (e.g., by the memory controller 102) the one or more rows 106 (e.g., those rows 106 mapped to another row in the mapping table 112) from a refresh of the DRAM module 104. The rows 106 having entries in the mapping table 112 and that will be excluded from a refresh are considered "merged rows" 106. In some embodiments, excluding 206 the one or more rows 106 from the refresh includes providing, to the DRAM module 104, an indication of those rows 106 that should or should not be refreshed during a next refresh operation. The DRAM module 104 then performs the refresh according to the received indication.

Figure 3:
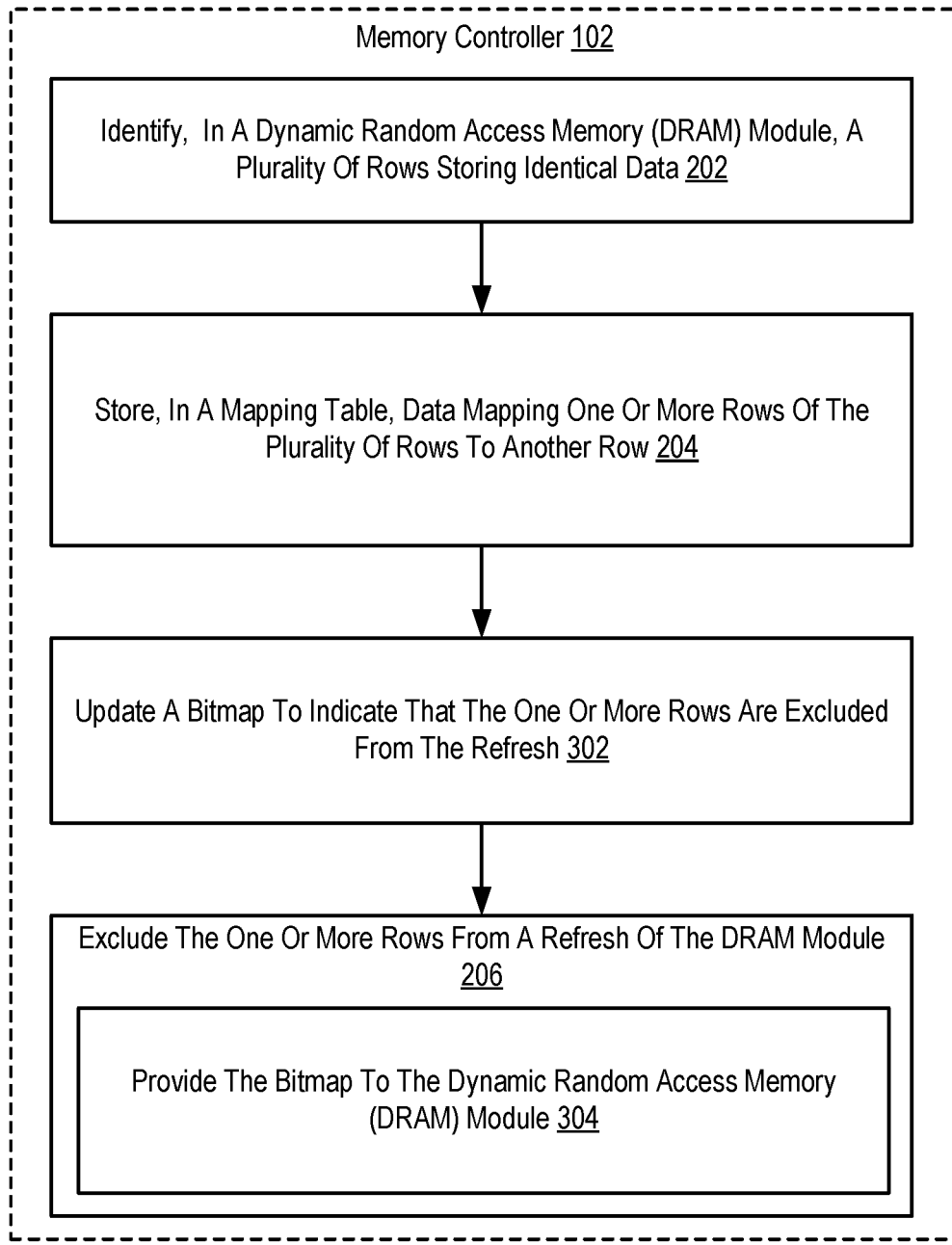
FIG. 3 is a flowchart of an example method for hardware-assisted DRAM row merging according to some embodiments.

For further explanation, FIG. 3 sets forth a method for hardware-assisted DRAM row merging according to embodiments of the present disclosure. The method of FIG. 3 is similar to FIG. 2 in that the method of FIG. 3 includes identifying 202 a plurality of rows storing identical data, storing 204, in a mapping table 112, data mapping one or more rows 106 of the plurality of rows to another row, and excluding 206 the one or more rows 106 from a refresh of the DRAM module 104.

FIG. 3 differs from FIG. 2 in that FIG. 3 includes updating 302 a bitmap (e.g., a refresh bitmap 114) to indicate that the one or more rows 106 are excluded from the refresh. For example, in some embodiments, the memory controller 102 maintains a refresh bitmap 114. Each row 106 corresponds to a bit in the refresh bitmap 114. Where a row 106 is mapped to another row (e.g., to a representative row or to a reserved row 108), the bit corresponding to the mapped row 106 (e.g., the row 106 having a mapping table 112 entry) is set (e.g., to "1") to indicate that the mapped row 106 should be skipped during a next refresh. For example, when a mapping table 112 entry is created to map a particular row 106, a bit in the refresh bitmap 114 corresponding to the particular row 106 is set to indicate that the particular row 106 are excluded from a next refresh.

The method of FIG. 3 further differs from FIG. 3 in that excluding 206 the one or more rows 106 from the refresh includes providing 304, to the DRAM module 104, the bitmap (e.g., the refresh bitmap 114). The DRAM module 104 then performs the refresh operation based on the received bitmap.

Figure 4:
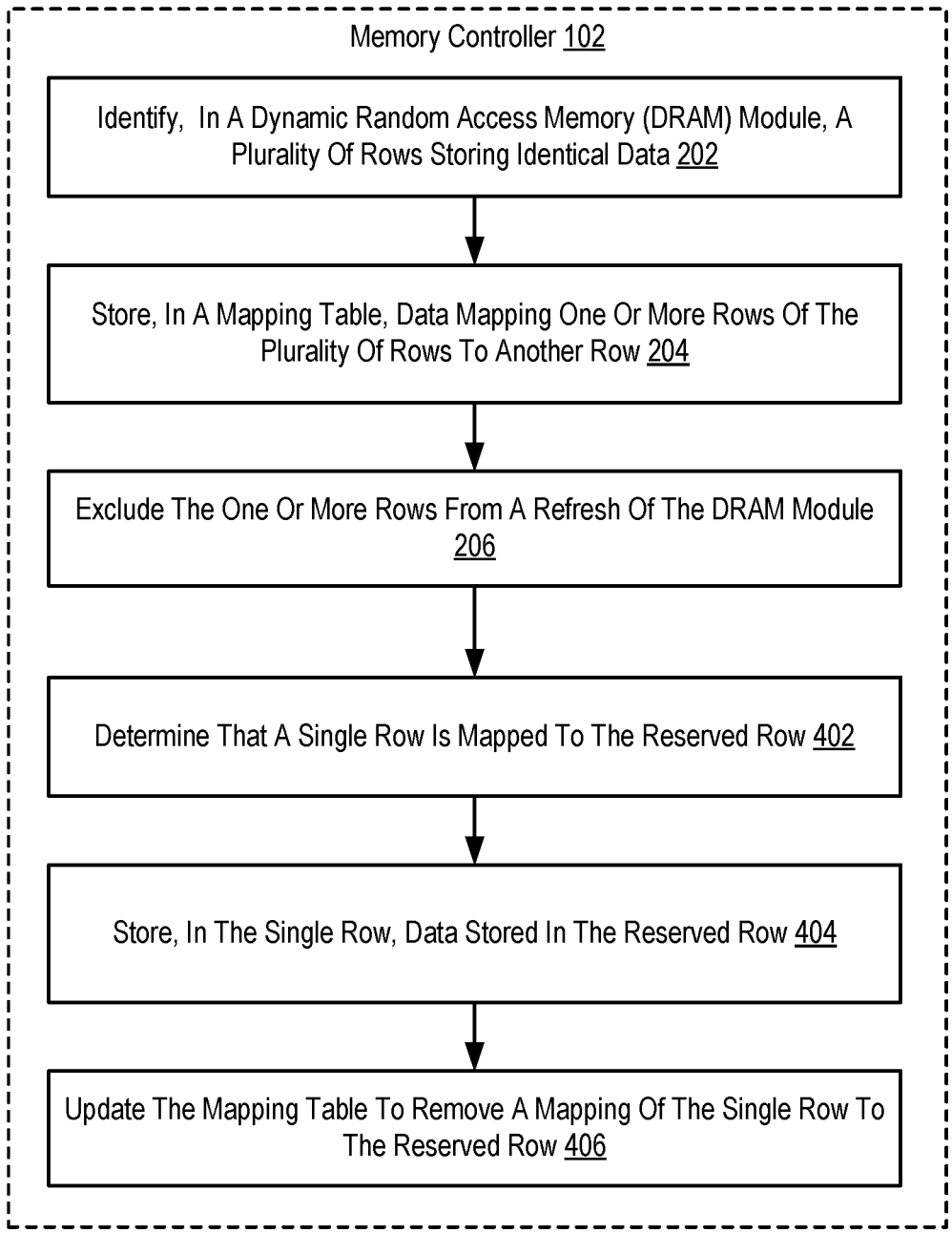
FIG. 4 is a flowchart of an example method for hardware-assisted DRAM row merging according to some embodiments.

For further explanation, FIG. 4 sets forth a method for hardware-assisted DRAM row merging according to embodiments of the present disclosure. The method of FIG. 4 is similar to FIG. 2 in that the method of FIG. 4 includes identifying 202 a plurality of rows storing identical data, storing 204, in a mapping table 112, data mapping one or more rows 106 of the plurality of rows to another row, and excluding 206 the one or more rows 106 from a refresh of the DRAM module 104104.

Assume that the other row to which the one or more rows 106 are mapped is a reserved row 108. FIG. 4 differs from FIG. 2 in that the method of FIG. 4 includes determining 402 that a single row 106 is mapped to the reserved row 108. Assume that, after multiple rows 106 were mapped to the reserved row 108, all but of these rows 106 ceased to be mapped to the reserved row 108. For example, write operations were performed that targeted the mapped rows 106 other than the single row 106. This would result in the rows 106 targeted by the write operations to store values different than the mapped reserved row 108, necessitating that they no longer be mapped to the reserved row 108.

In some embodiments, determining 402 that the single row 106 is mapped to the reserved row 108 includes determining when a counter 116 indicating a number of rows 106 mapped to the reserved row 108 is set to "1." As another example, determining 402 that the single row 106 is mapped to the reserved row 108 includes accessing mapping table 112 entries that map to the reserved row 108 and determine that a single mapping table 112 maps to the reserved row 108.

The method of FIG. 4 further includes storing 404, in the single row 106, the data stored in the reserved row 108. For example, the memory controller 102 issues a command to the DRAM module 104 that causes the data stored in the reserved row 108 to be copied or cloned to the single row 106 mapped to the reserved row 106. This ensures that the single row 106 stores the correct data in the event that data previously stored in the single row 106 has degraded due to lack of refresh.

The method of FIG. 4 further includes updating 406 the mapping table 112 to remove a mapping of the single row 106 to the reserved row 108. In some embodiments, the memory controller 102 then decrements the counter 116 corresponding to the reserved row 108 to zero. In some embodiments, this indicates that the reserved row 108 is unallocated and available for storage of other data for mapping other rows 106 for merging. In some embodiments, the memory controller 102 updates the refresh bitmap 114 to indicate that the single row 106, now no longer mapped to any reserved row 108, should be included in a next refresh.

Figure 5:
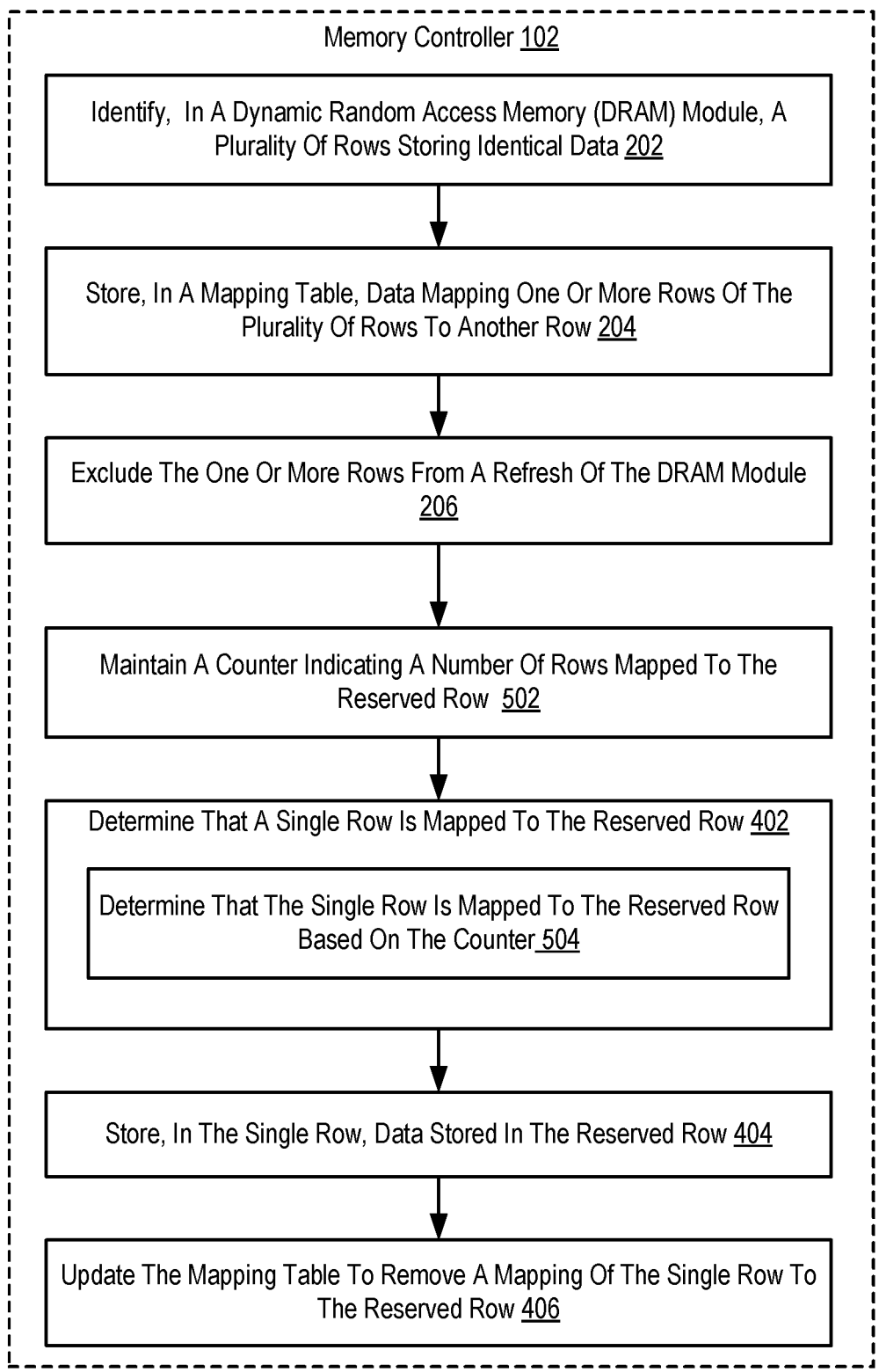
FIG. 5 is a flowchart of an example method for hardware-assisted DRAM row merging according to some embodiments.

For further explanation, FIG. 5 sets forth a method for hardware-assisted DRAM row merging according to embodiments of the present disclosure. The method of FIG. 5 is similar to FIG. 4 in that the method of FIG. 5 includes identifying 202 a plurality of rows storing identical data, storing 204, in a mapping table 112, data mapping one or more rows 106 of the plurality of rows to another row, and excluding 206 the one or more rows 106 from a refresh of the DRAM module 104, determining 402 that a single row 106 is mapped to the reserved row 108, storing 404, in the single row 106, the data stored in the reserved row 108, and updating 406 the mapping table 112 to remove a mapping of the single row 106 to the reserved row 108.

The method of FIG. 5 differs from FIG. 4 in that the method of FIG. 5 includes maintaining 502 a counter 116 indicating a number of rows 106 mapped to the reserved row 108. For example, the memory controller 102 maintains, for each reserved row 108, a corresponding counter 116 indicating a number of merged rows 106 mapped to the reserved row 108. For example, as a mapping table 112 entry is created mapping a merged row 106 to a reserved row 108, the memory controller 102 increments the counter 116 corresponding to the reserved row 108. When a merged row 106 ceases to be mapped to the reserved row 108 (e.g., in response to a write directed to the merged row 106), the counter 116 corresponding to the reserved row 108 is decremented. In some embodiments, the counters 116 are maintained in a same data structure as checksums 110 for each reserved row 108. For example, each entry in the data structure corresponds to a reserved row 108. Each entry in the data structure indicates, for the corresponding reserved row 108, a checksum 110 for data stored in the reserved row 108 (if any) and a counter 116 indicating a number of merged rows 106 mapped to the reserved row 108.

The method of FIG. 5 further differs from FIG. 4 in that determining 402 that a single row 106 is mapped to the reserved row 108 includes determining 504 that the single row 106 is mapped to the reserved row 108 based on the counter 116. For example, the memory controller 102 accesses the counter 116 for the reserved row 108 and determines that the counter 116 is set to "1."

Figure 6:
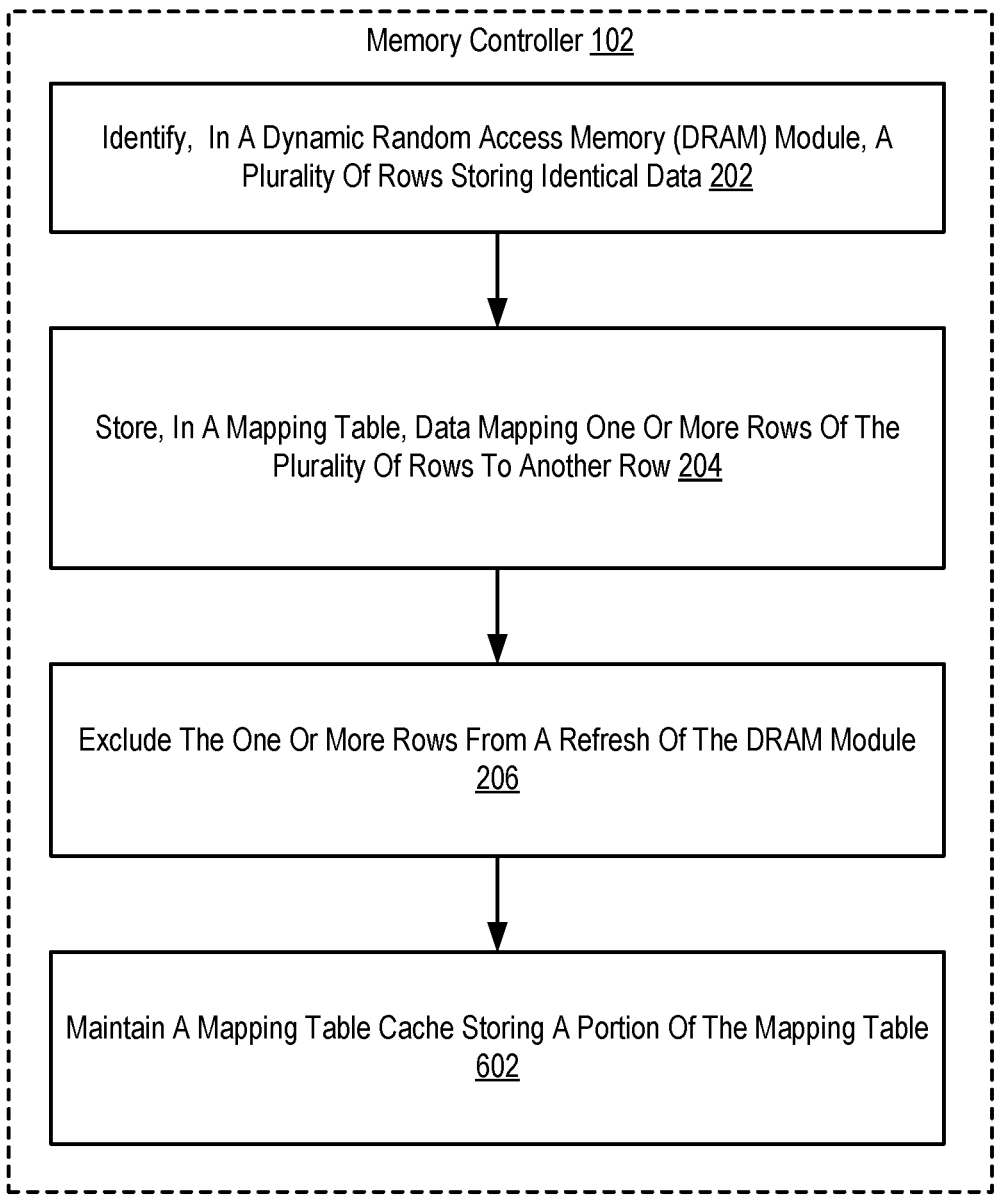
FIG. 6 is a flowchart of an example method for hardware-assisted DRAM row merging according to some embodiments.

For further explanation, FIG. 6 sets forth a method for hardware-assisted DRAM row merging according to embodiments of the present disclosure. The method of FIG. 6 is similar to FIG. 2 in that the method of FIG. 6 includes identifying 202 a plurality of rows storing identical data, storing 204, in a mapping table 112, data mapping one or more rows 106 of the plurality of rows to another row, and excluding 206 the one or more rows 106 from a refresh of the DRAM module 104.

FIG. 6 differs from FIG. 2 in that FIG. 6 includes maintaining 602 (e.g., by the memory controller 102) a mapping table cache 118 storing a portion of the mapping table 112. The mapping table cache 118 stores most recently or most frequently used mappings in the mapping table 112. For example, the memory controller 102 accesses the mapping table 112 to determine if a row 106 targeted by a read or write request is mapped to another row (e.g., a representative row or a reserved row 108). Where the memory controller 102 finds a match in the mapping table 112, the memory controller 102 updates the mapping table cache 118 to include the matching mapping table 112 entry. Thus, read or write requests are first compared to entries in the mapping table cache 118 before accessing the mapping table 112, reducing the number of accesses to the DRAM module 104 required to determine if a particular row 106 has been merged and mapped to another row.

Figure 7:
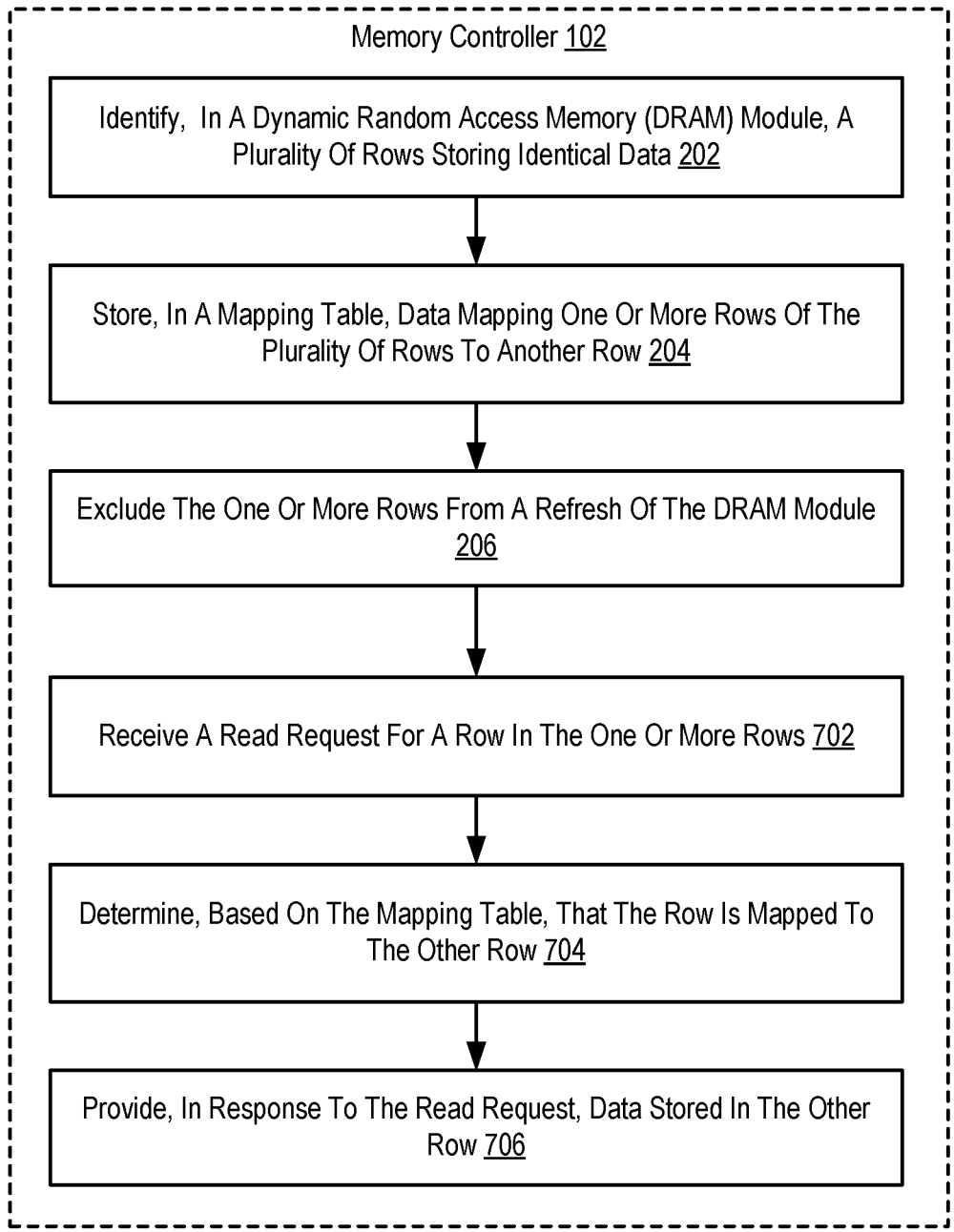
FIG. 7 is a flowchart of an example method for hardware-assisted DRAM row merging according to some embodiments.

For further explanation, FIG. 7 sets forth a method for hardware-assisted DRAM row merging according to embodiments of the present disclosure. The method of FIG. 7 is similar to FIG. 2 in that the method of FIG. 7 includes identifying 202 a plurality of rows storing identical data, storing 204, in a mapping table 112, data mapping one or more rows 106 of the plurality of rows to another row, and excluding 206 the one or more rows 106 from a refresh of the DRAM module 104.

FIG. 7 differs from FIG. 2 in that FIG. 7 includes receiving 702 (e.g., by the memory controller 102) a read request for a row 106 in the one or more rows 106 (e.g., a merged row 106 previously mapped to another row and excluded from a refresh). For example, assume that rows 106 A, B, and C were identified 202 as storing identical data and mapped to a reserved row 108. Further assume that the read request is for data stored in row 106 A. As the data stored in row 106 A has been excluded from a refresh, the data stored in row 106 A is susceptible to loss of integrity.

The method of FIG. 7 further includes determining 704, based on the mapping table 112, that the row 106 is mapped to the other row. Continuing with the example above, the memory controller 102 determines, based on the mapping table 112, that row 106 A is mapped to its corresponding reserved row 108. For example, in some embodiments, the memory controller 102 accesses the mapping table 112 from the DRAM module 104 and identifies an entry in the mapping table 112 for row 106 A. The entry then indicates the corresponding reserved row 108. In other embodiments, the memory controller 102 first accesses a mapping table cache 118 to determine if an entry for row 106 A is stored. If an entry is stored, the memory controller identifies the corresponding reserved row 108 based on the entry in the mapping table cache 118. If no entry is found for row 108

A, the memory controller 102 then accesses the mapping table 112 from the DRAM module 104 as described above.

The method of FIG. 7 further includes providing 706, in response to the read request, data stored in the other row (e.g., the row identified in the mapping table 112 and to which the merged row 106 is mapped). For example, the memory controller 102 reads from the row identified in the mapping table 112 and provides the requested data as a response to the read request. Thus, a read request targeted to a merged row 106 receives, in response, data stored in a row identified in the mapping table 112 as being a target of a mapping of the merged row 106.

Figure 8:
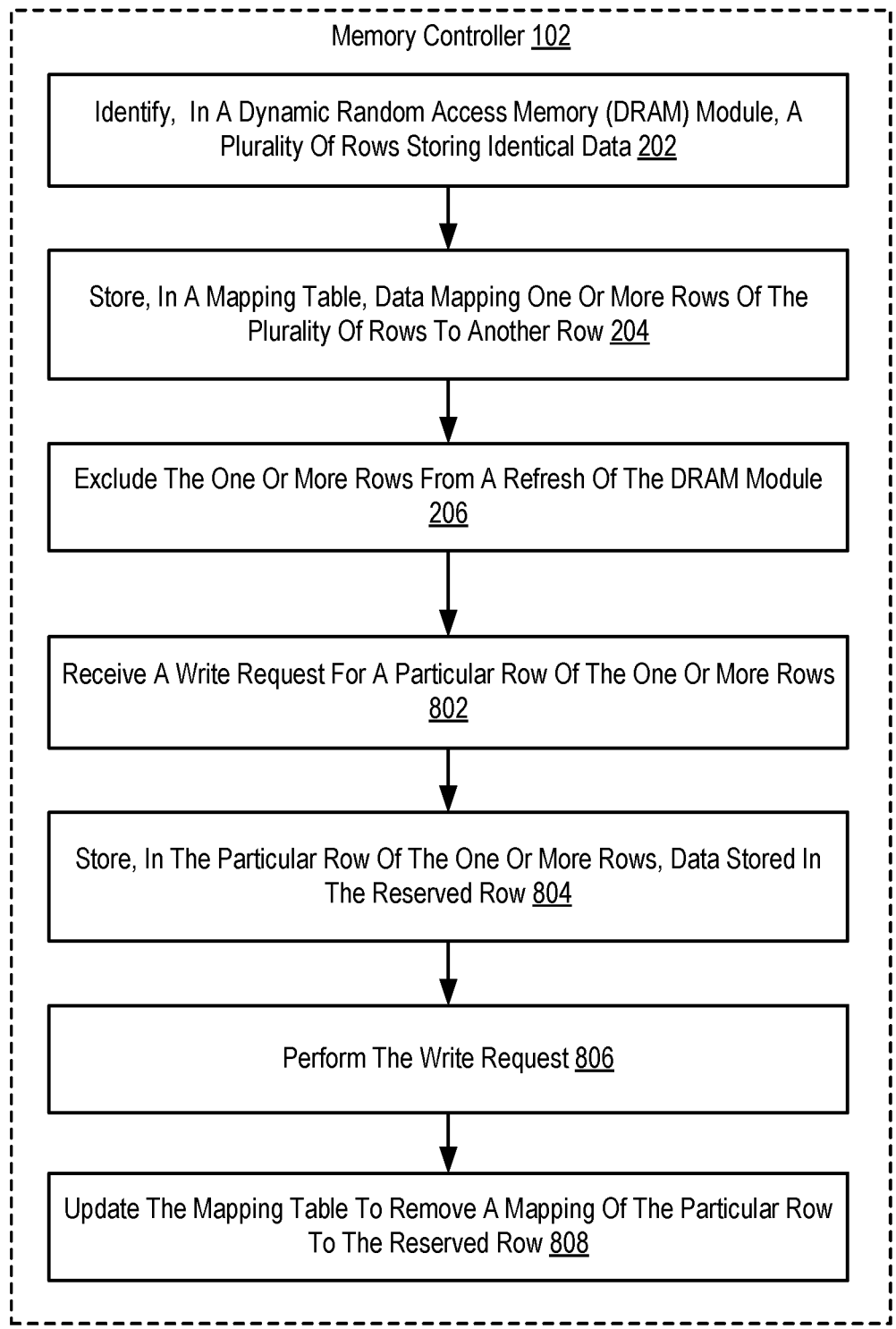
FIG. 8 is a flowchart of an example method for hardware-assisted DRAM row merging according to some embodiments.

For further explanation, FIG. 8 sets forth a method for hardware-assisted DRAM row merging according to embodiments of the present disclosure. The method of FIG. 8 is similar to FIG. 2 in that the method of FIG. 8 includes identifying 202 a plurality of rows storing identical data, storing 204, in a mapping table 112, data mapping one or more rows 106 of the plurality of rows to another row, and excluding 206 the one or more rows 106 from a refresh of the DRAM module 104.

Assume that the one or more rows 106 are mapped to a reserved row 108. FIG. 8 differs from FIG. 2 in that the method of FIG. 8 includes receiving 802 a write request for a row 106 of the one or more rows 106 (e.g., a merged row 106 mapped to the reserved row 108 and excluded from a refresh). For example, assume that rows 106 A, B, and C were identified 202 as storing identical data and mapped to a reserved row 108. Further assume that the read request is for data stored in row 106 A. As the data stored in row 106 A has been excluded from a refresh, the data stored in row 106 A is susceptible to loss of integrity.

The method of FIG. 8 also includes storing 804, in the row 106 of the one or more rows 106, data stored in the reserved row 108. Continuing with the example above, the memory controller 102 determines, based on the mapping table 112, that row 106 A is mapped to its corresponding reserved row 108. For example, in some embodiments, the memory controller 102 accesses the mapping table 112 from the DRAM module 104 and identifies an entry in the mapping table 112 for row 106 A. The entry then indicates the corresponding reserved row 108. In other embodiments, the memory controller 102 first accesses a mapping table cache 118 to determine if an entry for row 106 A is stored. If an entry is stored, the memory controller identifies the corresponding reserved row 108 based on the entry in the mapping table cache 118. If no entry is found for row 108 A, the memory controller 102 then accesses the mapping table 112 from the DRAM module 104 as described above. The memory controller 102 then loads the data stored in the identified reserved row 108 and stores this data in row A.

The method of FIG. 8 also includes performing 806 the write request. For example, the memory controller 102 issues the write request to the DRAM module 104 for application. Thus, any operations of the write request are applied to the row 106 indicated in the write request now storing the data of its corresponding reserved row 108.

The method of FIG. 8 also includes updating 808 the mapping table 112 to remove a mapping of the row 106 to the reserved row 108. As the row 106 has been written to, it no longer stores data identical to the reserved row 108. Thus, the mapping of the row 106 to the reserved row 108 is removed from the mapping table 112. Where a mapping table cache 118 is implemented, any mapping of the row 106 to the reserved row 108 is also removed from the mapping table cache 118.

In view of the explanations set forth above, readers will recognize that the benefits of hardware-assisted DRAM row merging include:

Improved performance of a computing system by reducing energy required to perform a DRAM refresh by refraining from refreshing selected rows having identical data.

Improved performance of a computing system by requiring less computational overhead compared to software-based solutions for data deduplication in DRAM.

The flowchart and block diagrams in the Figures illustrate the architecture, functionality, and operation of possible implementations of systems, methods, and computer program products according to various embodiments of the present disclosure. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes can be made in various embodiments of the present disclosure. The descriptions in this specification are for purposes of illustration only and are not to be construed in a limiting sense. The scope of the present disclosure is limited only by the language of the following claims.

What is claimed is:

1. A method for hardware-assisted Dynamic Random Access Memory (DRAM) row merging, the method comprising:
    mapping, by a memory controller in a mapping table, one or more rows of a plurality of rows storing identical data in a DRAM module to a representative row, the representative row selected from among the plurality of rows storing the identical data;
    storing an indication that the mapped rows are to be excluded from a refresh; and
    excluding the mapped rows from a refresh based on the indication.

2. The method of claim 1, further comprising:
    updating a bitmap to indicate that the mapped rows are excluded from the refresh, wherein excluding the mapped from the refresh comprises providing, by the memory controller, the bitmap to the DRAM module.

3. The method of claim 1, wherein the representative row comprises a reserved row included in one or more reserved rows of the DRAM module.

4. The method of claim 3, further comprising:
    determining that a single row is mapped to the reserved row;
    storing, in the single row, data stored in the reserved row; and
    updating the mapping table to remove a mapping of the single row to the reserved row.

5. The method of claim 4, further comprising:
maintaining a counter indicating a number of rows mapped to the reserved row, wherein determining that the single row is mapped to the reserved row is based on the counter.

6. The method of claim 1, further comprising maintaining a mapping table cache storing a portion of the mapping table.

7. The method of claim 1, further comprising:
receiving a read request for a row in the mapped rows;
determining, based on the mapping table, that the row is mapped to the representative row; and
providing, in response to the read request, data stored in the representative row.

8. The method of claim 3, further comprising:
receiving a write request for a particular row of the mapped rows;
storing, in the particular row of the mapped rows, data stored in the reserved row;
performing the write request; and
updating the mapping table to remove a mapping of the particular row to the reserved row.

9. A memory controller for hardware-assisted Dynamic Random Access Memory (DRAM) row merging, the memory controller comprising:
logic configured to:
map, in a mapping table, one or more rows of a plurality of rows storing identical data in a DRAM module to a representative row, the representative row selected from among the plurality of rows storing the identical data;
store an indication that the mapped rows are to be excluded from a refresh; and
exclude the mapped rows from a refresh based on the indication.

10. The memory controller of claim 9, wherein the logic is further configured to:
updating a bitmap to indicate that the mapped rows are excluded from the refresh, wherein excluding the mapped rows from the refresh comprises providing, by the memory controller, the bitmap to the DRAM module.

11. The memory controller of claim 9, wherein the representative row comprises a reserved row included in one or more reserved rows of the DRAM module.

12. The memory controller of claim 11, wherein the logic is further configured to:
determine that a single row is mapped to the reserved row;
store, in the single row, data stored in the reserved row; and
update the mapping table to remove a mapping of the single row to the reserved row.

13. The memory controller of claim 12, wherein the logic is further configured to:
maintain a counter indicating a number of rows mapped to the reserved row, wherein determining that the single row is mapped to the reserved row is based on the counter.

14. The memory controller of claim 9, wherein the logic is further configured to maintain a mapping table cache storing a portion of the mapping table.

15. The memory controller of claim 9, wherein the logic is further configured to:
receive a read request for a row in the mapped rows;
determine, based on the mapping table, that the row is mapped to the representative row; and
provide, in response to the read request, data stored in the representative row.

16. The memory controller of claim 11, wherein the logic is further configured to:
receive a write request for a particular row of the mapped rows;
store, in the particular row of the mapped rows, data stored in the reserved row;
perform the write request; and
update the mapping table to remove a mapping of the row to the reserved row.

17. An apparatus for hardware-assisted Dynamic Random Access Memory (DRAM) row merging, comprising:
a processor;
a memory;
a memory controller coupling the processor to the memory, the memory controller configured to:
map, in a mapping table, one or more rows of a plurality of rows storing identical data in a DRAM module to a representative row, the representative row selected from among the plurality of rows storing the identical data;
store an indication that the mapped rows are to be excluded from a refresh; and
exclude the one or more rows from a refresh based on the indication.

18. The apparatus of claim 17, wherein the memory controller is further configured to:
update a bitmap to indicate that the mapped rows are excluded from the refresh; and
wherein excluding the mapped rows from the refresh comprises providing, by the memory controller, the bitmap to the DRAM module.

* * * * *